(12) United States Patent
Rickert et al.

(10) Patent No.: US 7,661,046 B2
(45) Date of Patent: *Feb. 9, 2010

(54) METHOD AND DUAL INTERLOCKED STORAGE CELL LATCH FOR IMPLEMENTING ENHANCED TESTABILITY

(75) Inventors: Dennis Martin Rickert, Rochester, MN (US); Byron D. Scott, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 399 days.

This patent is subject to a terminal disclaimer.

(21) Appl. No.: 11/682,081

(22) Filed: Mar. 5, 2007

(65) Prior Publication Data

US 2008/0222468 A1    Sep. 11, 2008

(51) Int. Cl.
G01R 31/28 (2006.01)
H03K 3/00 (2006.01)
H03K 3/289 (2006.01)
H03K 19/003 (2006.01)

(52) U.S. Cl. ............ 714/726; 714/729; 327/199; 327/202; 326/10; 326/12

(58) Field of Classification Search ............ 714/726, 714/729; 326/10, 12; 327/199, 202
See application file for complete search history.

(56) References Cited

U.S. PATENT DOCUMENTS

| | | | | |
|---|---|---|---|---|
| 6,127,864 A | * | 10/2000 | Mavis et al. | 327/144 |
| 7,095,262 B2 | * | 8/2006 | Petersen et al. | 327/197 |
| 7,215,581 B2 | * | 5/2007 | Lotz et al. | 365/189.05 |
| 2008/0180153 A1 | * | 7/2008 | Sachdev et al. | 327/208 |
| 2008/0222469 A1 | * | 9/2008 | Rickert et al. | 714/726 |

* cited by examiner

Primary Examiner—John J Tabone, Jr.
(74) Attorney, Agent, or Firm—Robert R. Williams

(57) ABSTRACT

A method and a Dual Interlocked Storage Cell (DICE) latch implementing enhanced testability includes an L1 latch and an L2 latch coupled to the L1 latch. Each L1 latch and each L2 latch includes redundant latch structures. A separate output is provided with the redundant L2 latch. The DICE latch includes a Redundant Test Latch Enable (RTLE) input. Each L1 latch and each L2 latch includes a path selector control in the redundant latch structures controlled by the RTLE input providing each of the redundant latch structures in a scan path during a test mode.

20 Claims, 8 Drawing Sheets

100

LSSD L1 LATCH TRUTH TABLE 300

| INPUTS | | | | | | L1 STATE |
|---|---|---|---|---|---|---|
| SD | D0 | D1 | A | I | C | |
| - | - | - | 0 | - | 0 | NC |
| - | - | - | 1 | - | 0 | I |
| 0 | - | - | 0 | - | 1 | D0 |
| 1 | - | - | 0 | - | 1 | D1 |

FIG. 3A

LSSD L2 LATCH TRUTH TABLE 310

| INPUTS | | OUTPUT |
|---|---|---|
| L1 | B | L2 |
| - | 0 | NC |
| - | 1 | L1 |

FIG. 3B

METHOD AND DUAL INTERLOCKED STORAGE CELL LATCH FOR IMPLEMENTING ENHANCED TESTABILITY

FIELD OF THE INVENTION

The present invention relates generally to the data processing field, and more particularly, relates to a method and Dual Interlocked Storage Cell (DICE) latch for implementing enhanced testability.

DESCRIPTION OF THE RELATED ART

A conventional DICE latch having redundant, cross-coupled latch structures, is not completely testable. The conventional DICE latch includes a pair of L1 latches and a pair of L2 latches that are provided as redundant structures.

Due to the redundant structures and crosscoupling, a single manufacturing defect in one of the latches or in the crosscoupling would not be detected during testing in the conventional DICE latch design. With a single defect the latch could still function as a latch, but not provide effective performance as a DICE latch.

A need exists for an improved Dual Interlocked Storage Cell (DICE) latch for implementing enhanced testability. It is desirable to provide such improved Dual Interlocked Storage Cell (DICE) latch that enables testing of each of the pair of L1 latches and each of the pair of L2 latches.

SUMMARY OF THE INVENTION

Principal aspects of the present invention are to provide a method and Dual Interlocked Storage Cell (DICE) latch for implementing enhanced testability. Other important aspects of the present invention are to provide such method and Dual Interlocked Storage Cell (DICE) latch for implementing enhanced testability substantially without negative effect and that overcome many of the disadvantages of prior art arrangements.

In brief, a method and Dual Interlocked Storage Cell (DICE) latch are provided for implementing enhanced testability. The DICE latch includes an L1 latch and an L2 latch coupled to the L1 latch. Each L1 latch and each L2 latch includes redundant latch structures. A separate output is provided with the redundant L2 latch. The DICE latch includes a Redundant Test Latch Enable (RTLE) input. Each L1 latch and each L2 latch includes a path selector control in the redundant latch structures controlled by the RTLE input providing each of the redundant latch structures in a scan path during a test mode.

In accordance with features of the invention, a combination of a path selector controls and multiple test patterns enable testing of all paths and nodes within the Dice Latch to ensure that all the elements of the DICE latch are manufactured correctly and without defect and also that the DICE latch operates correctly under the functional conditions with the redundancy enabled.

BRIEF DESCRIPTION OF THE DRAWINGS

The present invention together with the above and other objects and advantages may best be understood from the following detailed description of the preferred embodiments of the invention illustrated in the drawings, wherein:

FIGS. 3A and 3B are tables respectively illustrating operation of a level sensitive scan design (LSSD) L1 latch and L2 latch of the Dual Interlocked Storage Cell (DICE) latch of FIGS. 1 and 2 in accordance with the preferred embodiment;

DETAILED DESCRIPTION OF THE PREFERRED EMBODIMENTS

In accordance with features of the invention, a Dual Interlocked Storage Cell (DICE) latch is provided that is completely testable. The DICE latch of the invention is arranged such that all four latches can operate independently and can be individually observed and controlled under manufacturing test conditions. This enables all the faults along both paths to be observed and tested. This also puts both pairs of L1/L2 latches in the scan path for full controllability and observably under test conditions. Under test the redundant pairs of L1/L2 latches are scanned as two separate L1/L2 pairs.

In accordance with features of the invention, a Redundant Test Latch Enable (RTLE) input is provided for controlling a path selector control in each L1 latch and each L2 latch. Both the L1 latch and L2 latch includes redundant latch structures. A second L2 output (L22) to the redundant L2 latch. The path selector controls are operatively controlled by the RTLE input for providing each of the redundant latch structures in a scan path. However if the RTLE signal only ran in one direction then faults could be missed along the other multiplexer path leg and the redundant interconnect path of the latches. A limited set of patterns is generated that are run in the redundant mode to verify that these connections are there and the latch still operates correctly. These patterns scan initialize into the two L1/L2 pairs under RTLE mode or test mode and then switch to not-RTLE mode or functional mode and clock the data through the functional paths and then scan out those results.

Figure 1:
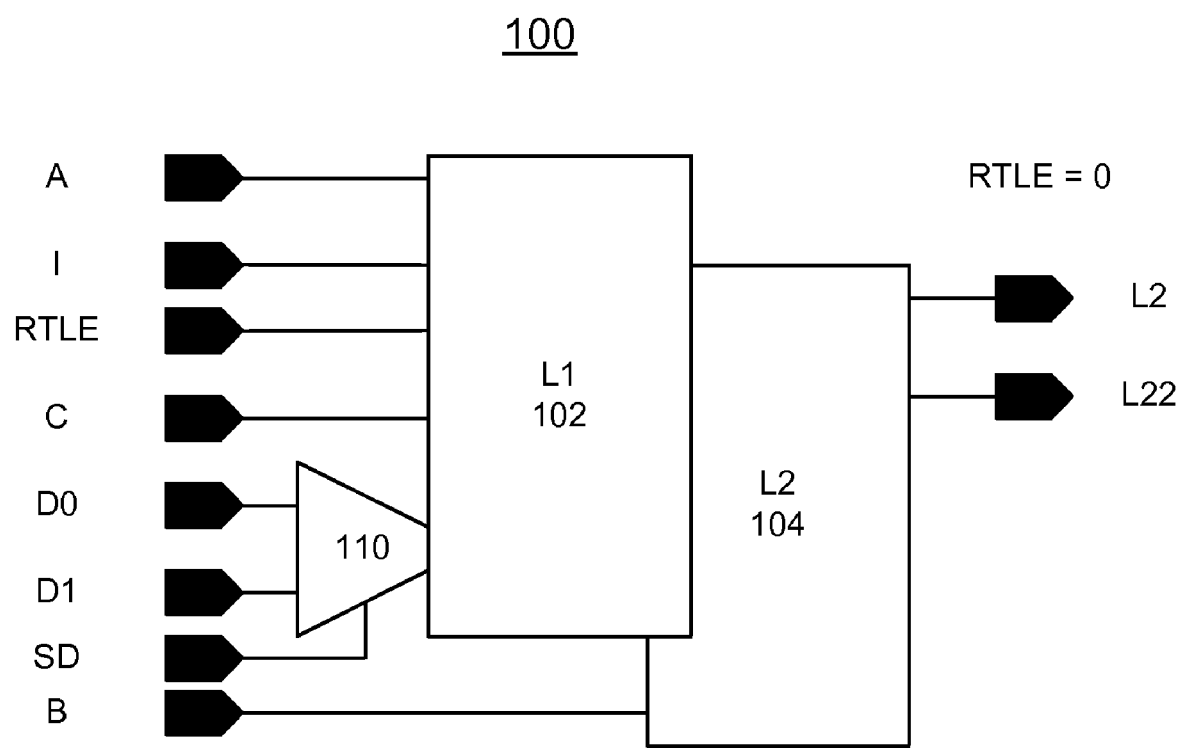
FIGS. 1 and 2 are block diagram representations illustrating a Dual Interlocked Storage Cell (DICE) latch for implementing enhanced testability in accordance with the preferred embodiment.
Figure 2:
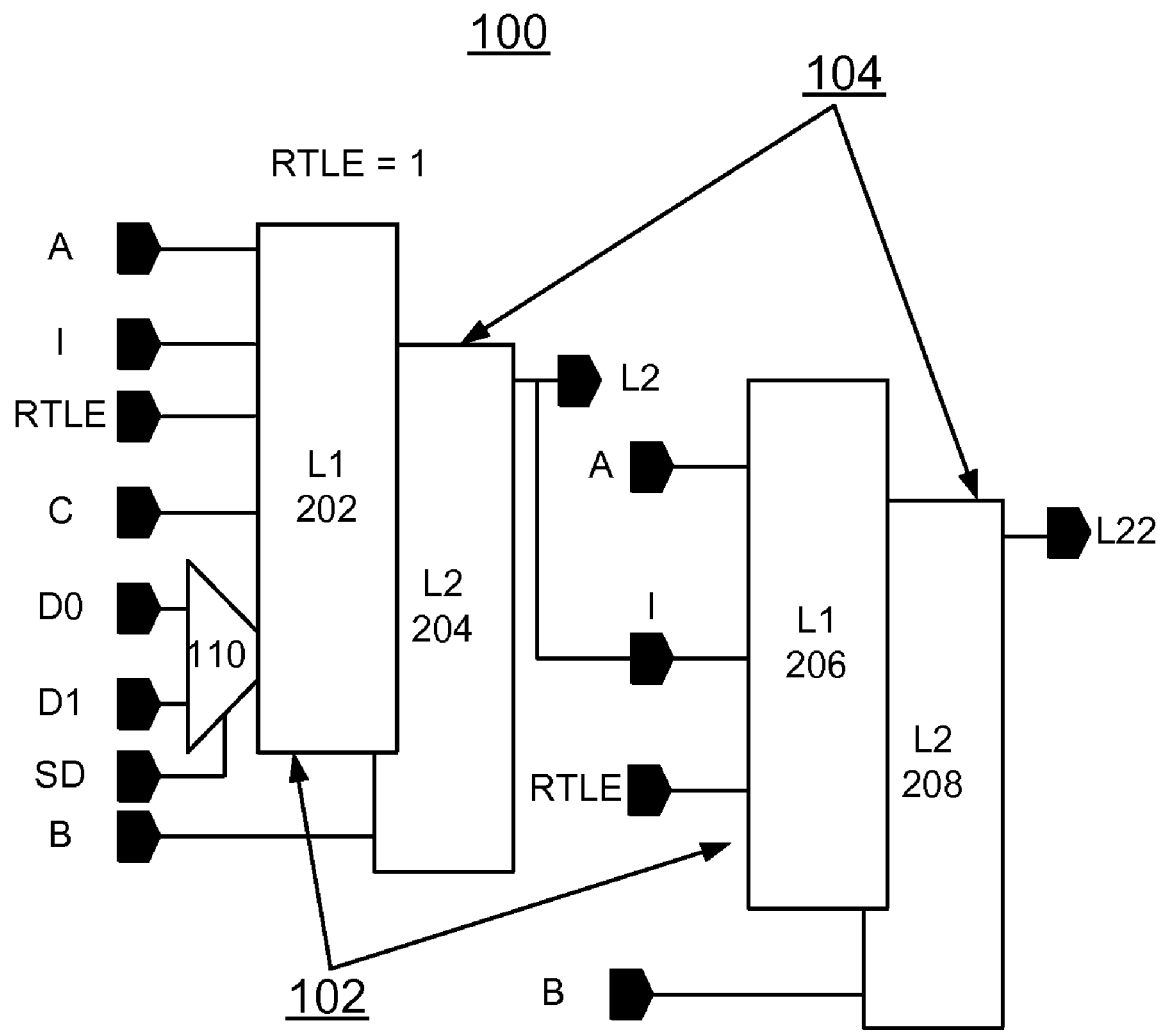

Having reference now to the drawings, in FIGS. 1 and 2 there is shown a Dual Interlocked Storage Cell (DICE) latch for implementing enhanced testability generally designated by the reference character 100 in accordance with the preferred embodiment. The DICE latch 100 including an L1 latch 102 and an L2 latch 104 coupled to the L1 latch 102 is a shift register latch or level sensitive scan design (LSSD) L1L2 latch implemented in accordance with a method of the preferred embodiment.

L1 latch 102 has a scan in data I and a pair of data inputs D0 and D1, one of the data inputs D0 and D1 selectively applied by a multiplexer 110 responsive to a data select input SD. L1 latch 102 has a pair of mutually exclusive clocks A and C, and an output L1_TP. When the clock A is active, the scan in data I becomes the content of the latch. The scan in data I path is used for testing. When the clock C is active, the selected data input D0 or D1 value is loaded into the latch.

L1 latch 102 has a Redundant Test Latch Enable (RTLE) input RTLE. The DICE latch 100 is illustrated in FIG. 1 with the input RTLE equal to zero (RTLE=0).

L2 latch 104 has a single input clock B, and the clocks B and C are the inverse of each other in normal functional mode. L2 latch 104 includes a pair of L2 latch outputs L2, L22 in accordance with the preferred embodiment. In operation of the L2 latch 104 of DICE latch 100 when clock B is active, the output of the L1 latch 102 is transferred into the L2 latch 104. The common implementation of logic alternates the clocks C and B during normal operation and the output at nodes L2, L22 of the L2 latch 104 is used to drive subsequent logic.

FIG. 2 illustrates the DICE latch 100 with the input RTLE equal to one (RTLE=1) for implementing enhanced testability in accordance with the preferred embodiment.

Referring now to FIG. 2, each of the L1 latch 102 and the L2 latch 104 includes redundant L1 and L2 latch structures, each including a path selector control 480. An exemplary path selector control 480 is illustrated and described with respect to FIG. 4C. The path selector control 480 is controlled by the RTLE input providing each of the redundant latch structures L1 latch 202, L2 latch 204, and L1 latch 206, and L2 latch 208 in a scan path.

Referring now to FIGS. 3A and 3B, operation of the DICE latch 100 is shown. In FIG. 3A a LSSD L1 latch truth table 300 provides an L1 state of the L1 latch 102 is illustrated. As shown, with an active input clock A, the L1 state is scan-in I. With an active input clock C, and the data select input SD is zero (SD=0), then the L1 state is data in D0. With an active input clock C, and the data select input SD is one (SD=1), then the L1 state is data in D1.

In FIG. 3B, a LSSD L2 latch truth table 310 provides an output with inputs L1 and clock B. As shown, with an active input clock B, the L2 state is the L1 state.

Figure 4A:
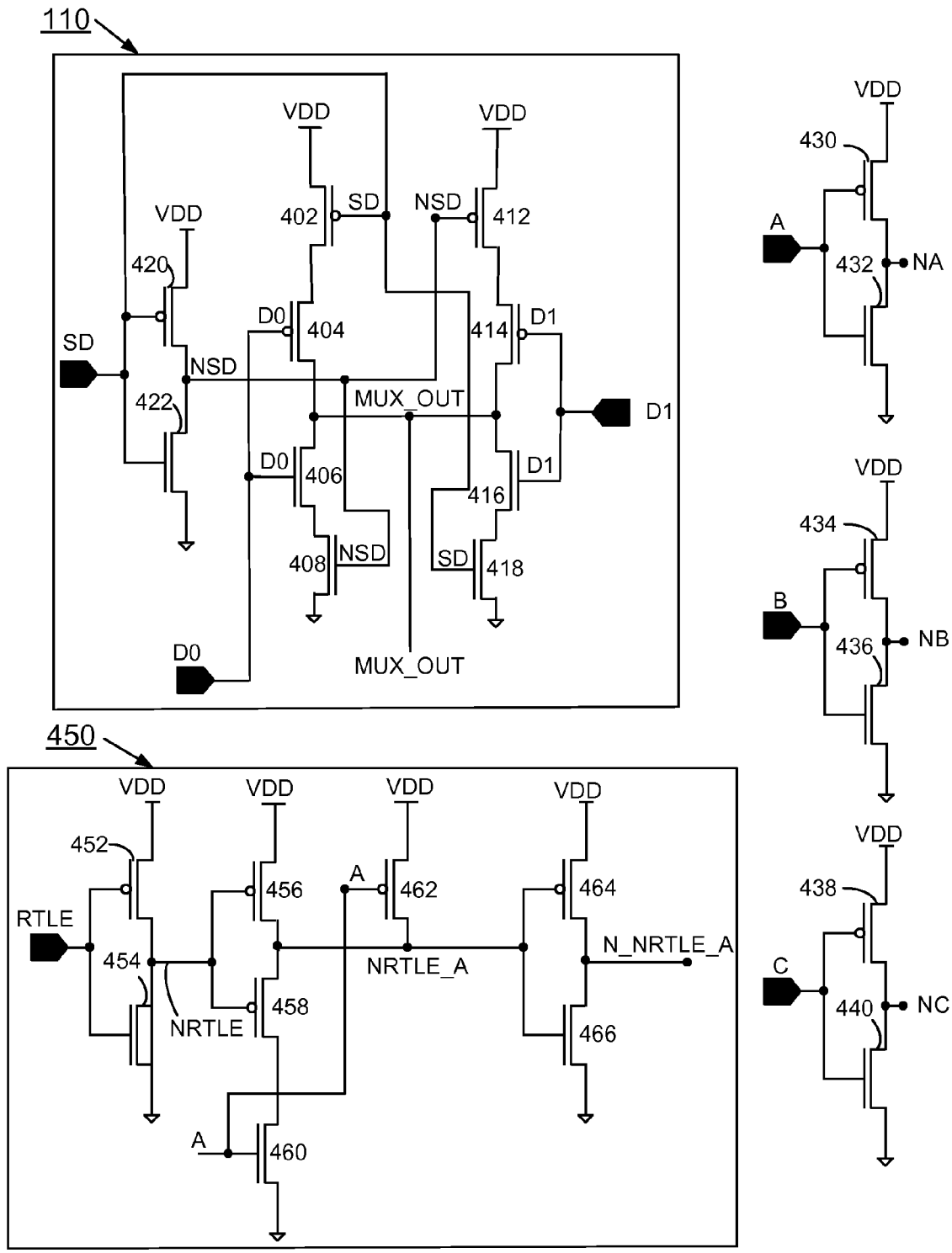
FIGS. 4A, 4B and 4C are schematic diagrams respectively illustrating exemplary functional circuits of the Dual Interlocked Storage Cell (DICE) latch of FIGS. 1 and 2 in accordance with the preferred embodiment.
Figure 4B:
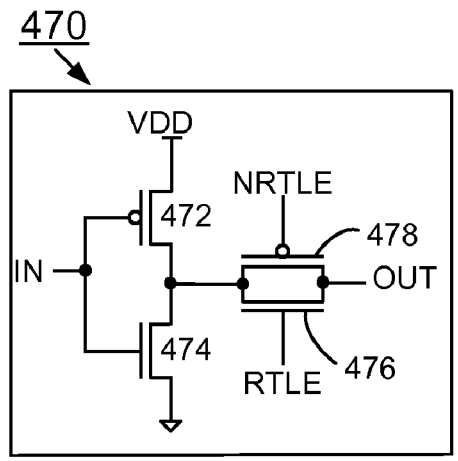
Figure 4C:
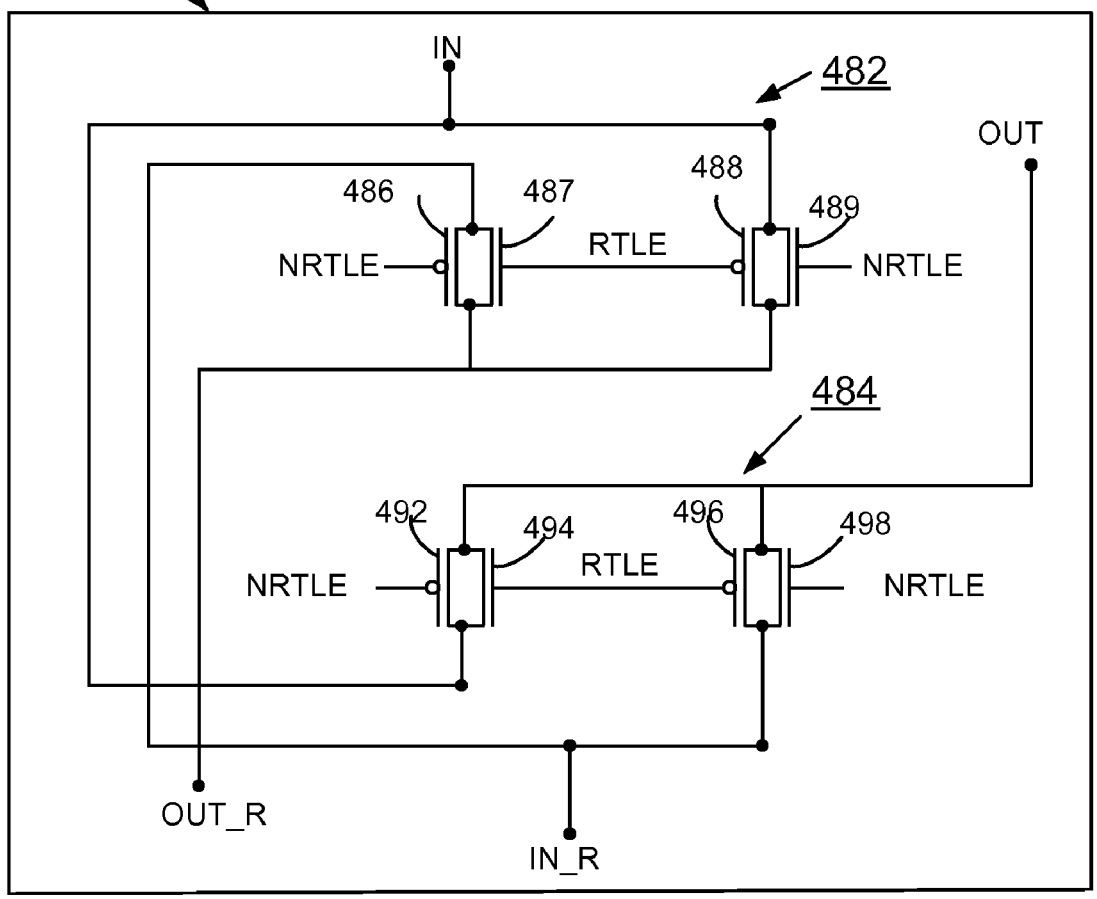

Referring now to FIGS. 4A, 4B and 4C, there are shown exemplary functional circuits of the DICE latch 100 in accordance with the preferred embodiment.

In FIG. 4A, an exemplary multiplexer 110 for selecting between data inputs D0, D1 responsive to the data select input SD is shown. Multiplexer 110 includes a first transistor stack of a pair of P-channel field effect transistors (PFETs) 402, 404, and a pair of N channel field effect transistors (NFETs) 406 408 connected in series between a voltage supply rail VDD and ground. Multiplexer 110 includes a second transistor stack of a pair of PFETS 412, 414 and a pair of NFETS 416, 418 connected in series between the voltage supply rail VDD and ground. The data select input SD is applied to an inverter defined by a PFET 420 and NFET 422 connected between the voltage supply rail VDD and ground. The data select input SD is applied to the gate of PFET 402 and the data input D0 is applied to the gate of PFET 404 and NFET 406. The data select input SD is applied to the gate of NFET 418 and the data input D1 is applied to the gate of PFET 414 and NFET 416. The inverted data select input NSD is applied to the gate of NFET 408 and the gate of PFET 412. Multiplexer 110 includes an output MUX_OUT provided by the common connection of the drain source connection of PFET 404, NFET 406 in the first transistor stack for selecting the data input D0 and the drain source connection of PFET 414, NFET 416 in the second transistor stack for selecting the data input D1.

In FIG. 4A, a plurality of clock inverters is shown respectively receiving and inverting the clock A, clock B, and clock C. As shown, the clock inverters are respectively defined by a PFET 430 and NFET 432, a PFET 434 and NFET 436, and a PFET 438 and NFET 440, each connected between the voltage supply rail VDD and ground.

In FIG. 4A, an exemplary decoder 450 receiving the Redundant Test Latch Enable (RTLE) input and the clock A is shown. Decoder 450 includes an inverter defined by a PFET 452 and NFET 454 receiving RTLE input, connected between the voltage supply rail VDD and ground and providing an inverted signal NRTLE. Decoder 450 includes a NAND gate defined by a pair of series connected PFET 456 and NFET 458 receiving a gate input of the inverted signal NRTLE and connected in series with an NFET 460 receiving a gate input of the clock A. The series connected PFET 456, NFET 458 and NFET 460 are connected between the voltage supply rail VDD and ground. A PFET 462 receiving a gate input of the clock A is connected between the voltage supply rail VDD and the drain source connection of PFET 456 and NFET 458 at node NRTLE_A. The output NRTLE_A at drain source connection of PFETs 456, 462 and NFET 458 is inverted by an inverter defined by a PFET 464 and an NFET 466 providing an output N_NRTLE_A.

The RTLE input equals 0 for the functional mode and RTLE input equals 1 for the test mode. The combination of the Redundant Test Latch Enable (RTLE) input and the clock A operates as follows:

| RTLE | A | NRTLE_A | N_NRTLE_A | |
|---|---|---|---|---|
| 0 | 0 | 1 | 0 | Functional, Not Scan |
| 0 | 1 | 0 | 1 | Functional, Scan |
| 1 | 0 | 1 | 0 | Test, Not Scan |
| 1 | 1 | 1 | 0 | Test, Scan |

Figure 5:
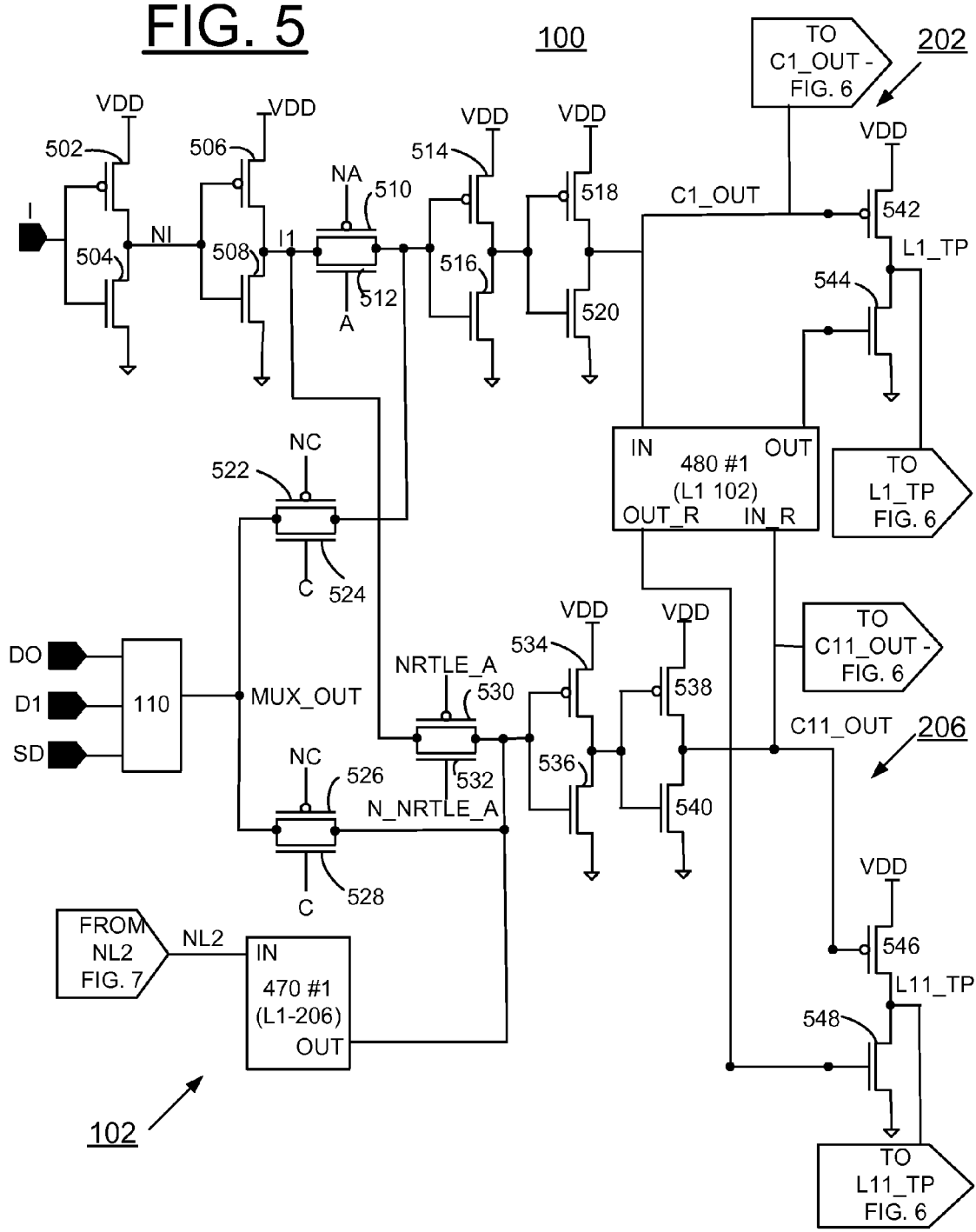
FIGS. 5, 6, and 7 together provide a schematic diagram representation of an exemplary Dual Interlocked Storage Cell (DICE) latch of FIGS. 1 and 2 in accordance with the preferred embodiment.

Referring now to FIG. 4B, an exemplary selector circuit 470 of the DICE latch 100 is shown. Selector circuit 470 includes an input inverter defined by a PFET 472 and NFET 474 providing an inverted input NIN. Selector circuit 470 includes a passgate defined by an NFET 476 receiving a gate input of the RTLE input and a PFET 478 receiving a gate input of the inverted input NRTLE providing an output OUT. As shown in FIG. 5, selector circuit 470 couples the inverted L2 latch output NL2 to the redundant L1 latch 206 of the L1 latch 102.

Referring now to FIG. 4C, an exemplary path selector control circuit 480 of the DICE latch 100 is shown. Path selector control circuit 480 includes a first input IN from a first latch structure and a second input IN_R from a redundant latch structure. Path selector control circuit 480 provides a first output OUT to the first latch structure and a second output OUT_R to the redundant latch structure. Path selector control circuit 480 includes a crosscoupled pair of passgate control selectors 482, 484. The first crosscoupled passgate control selector 482 includes a pair of passgates respectively defined by a first PFET 486 and an NFET 487, and a second PFET 488 and an NFET 489. The second passgate control selector includes a pair of passgates respectively defined by a first PFET 492 and an NFET 494, and a second PFET 496 and an NFET 498. The RTLE input is applied to the gate input of NFET 487, and PFET 488 in the first passgate control selector 482 and NFET 494, and PFET 496 in the second passgate control selectors 484. The NRTLE input is applied to the gate input of PFET 486, and NFET 489 in the first passgate control selector 482, and PFET 492, and NFET 498 in the second passgate control selector 484.

In operation, with NRTLE at a high potential and RTLE at a low potential or equal to zero, the first PFET 486 and an NFET 487 are not conducting or blocking, and the PFET 488 and NFET 489 are conducting or transparent in the first passgate control selector 482, and first PFET 492 and an NFET 494 are not conducting or blocking, and the PFET 496 and NFET 498 are conducting or transparent in the second passgate control selector 484. Then the path selector control circuit 480 connects the input IN to the redundant output OUT_R and the input IN_R to the output OUT.

With NRTLE at a low potential and RTLE at a high potential or equal to one, the first PFET 486 and an NFET 487 are conducting or transparent, and the PFET 488 and NFET 489 are not conducting or blocking in the first pass-gate control selector 482, and first PFET 492 and an NFET 494 are conducting or transparent, and the PFET 496 and NFET 498 are not conducting or blocking in the second passgate control selector 484. Then the path selector control circuit 480 connects the input IN to the output OUT and the input IN_R to the redundant output OUT_R.

Figure 6:
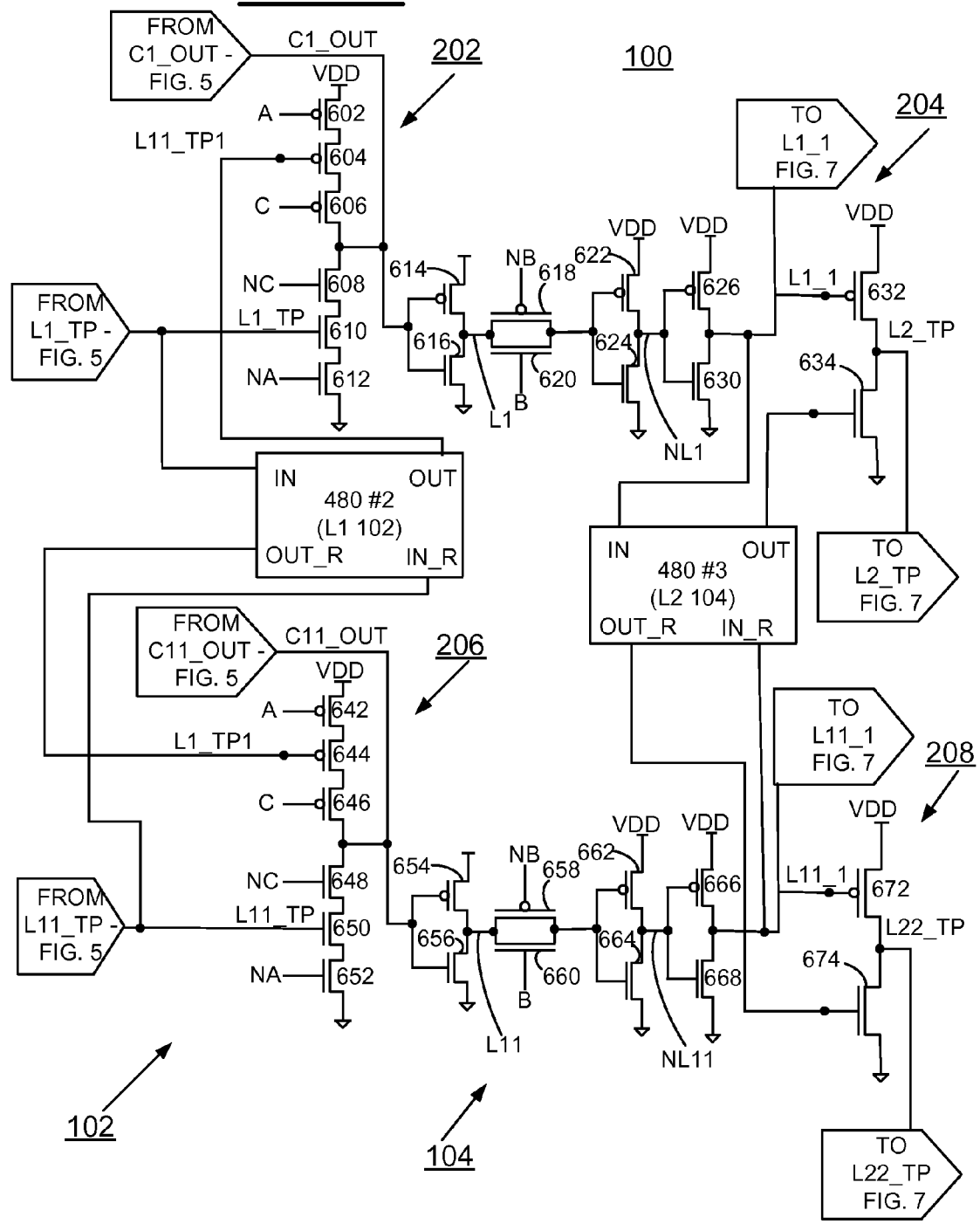

The path selector control circuits 480 are operatively controlled by the RTLE input for providing the latch pairs, L1 latch 202, L2 latch 204 and L1 latch 206, L2 latch 208 in a scan test path as shown in FIG. 2 with the RTLE input equal to one (RTLE=1) during the test mode of the DICE latch 100. The pair of L1 latches 202, 206, (L1 102) includes two path selector control circuits 480, #1, #2, as shown in FIGS. 5 and 6. The pair of L2 latches 204, 208, (L2 104) includes two path selector control circuits 480, #3, #4, as shown in FIGS. 6 and 7.

Figure 7:
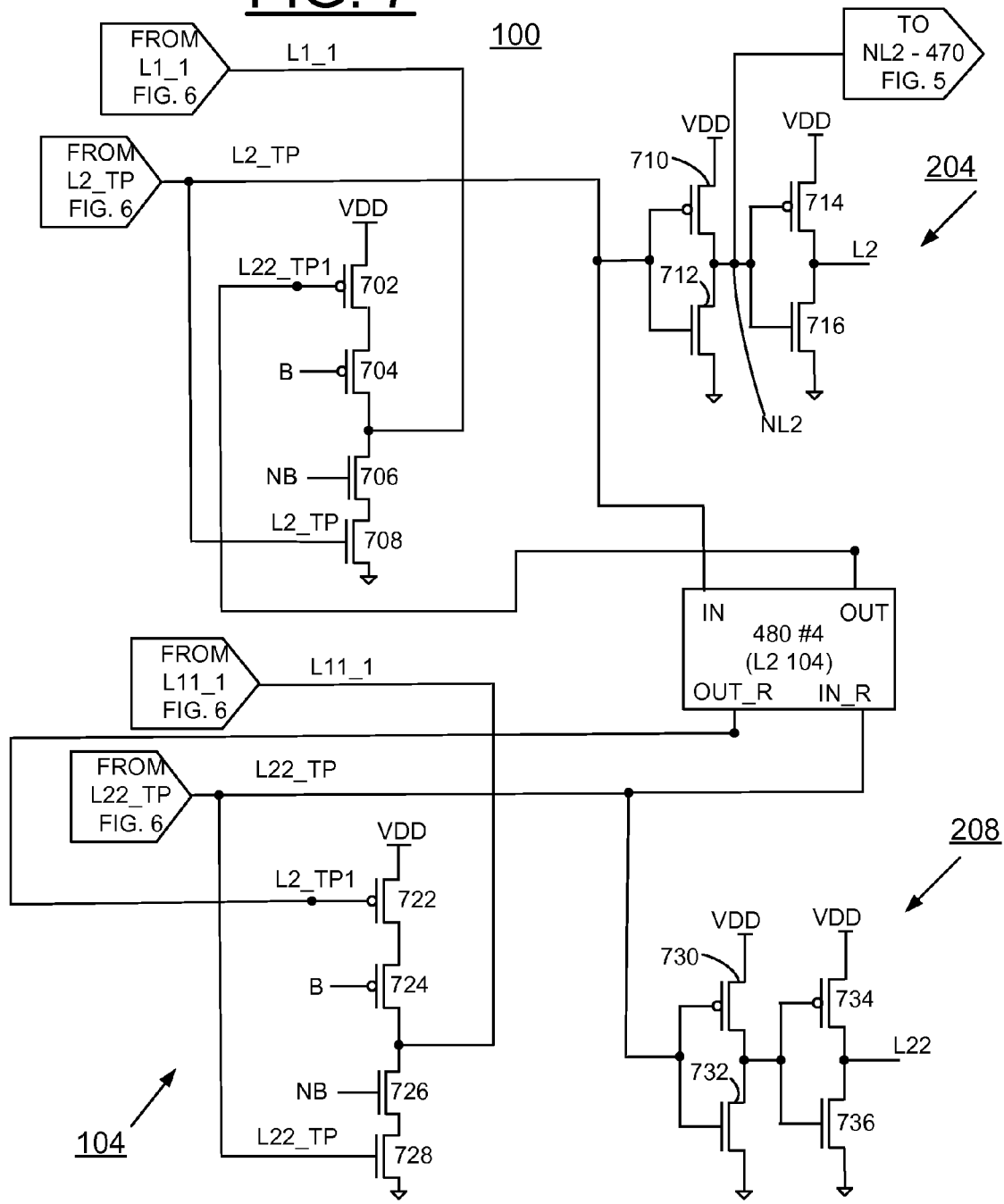

Referring to FIGS. 5, 6, and 7, there is shown an exemplary Dual Interlocked Storage Cell (DICE) latch 100 in accordance with the preferred embodiment. In FIGS. 5, 6, and 7, a first latch structure and a redundant latch structure of the L1 latch 102 and the L2 latch 104 are respectively shown in the upper and lower portions of the drawings.

Referring to FIG. 5, there is shown a first portion of the L1 latch 102 that includes L1 latch 202 and L1 latch 206. The scan input I is applied to a first inverter defined by a PFET 502 and an NFET 504. The inverted scan input NI is applied to a second inverter connected to the first inverter and defined by a PFET 506 and an NFET 508. The second inverted scan input I1 is coupled to a first passgate controlled by clock A and defined by a PFET 510 and an NFET 512 with NA applied to the gate of PFET 510 and clock A applied to the gate of NFET 512. A second pair of series connected inverters coupled to the first passgate output is respectively defined by a PFET 514 and an NFET 516 and a PFET 518 and an NFET 520 having an output at a node C1_OUT.

The selected data input D0 or D1 is coupled via multiplexer 110 to a pair of passgates controlled by the clock C of the L1 latch 202 and redundant L1 latch 206. A PFET 522 and an NFET 524, and a PFET 526 and an NFET 528 respectively define the passgates controlled by the clock C. The second inverted scan input I1 is coupled to a second passgate controlled by clock NRTLE_A and defined by a PFET 530 and an NFET 532. The passgate output of clock C passgate PFET 522 and NFET 524 is connected to the pass-gate output of clock A passgate PFET 510 and NFET 512 and applied to the second pair of series connected inverters of the L1 latch 202. The passgate output of clock C passgate PFET 526 and NFET 528 is connected to the passgate output of the clock NRTLE_A passgate PFET 530 and NFET 532 and applied to a pair of series connected inverters of the redundant L1 latch 206. A PFET 534 and an NFET 536 and a PFET 538 and an NFET 540 having an output at a node C11_OUT respectively define the series connected inverters of the L1 latch 206.

As shown in FIGS. 5, 6, and 7, DICE latch 100 includes a plurality of path selector control circuits 480 operatively controlled by the RTLE input and included in the redundant latch structures of L1 latch 202, L1 latch 206, L2 latch 204, and L2 latch 208 of the L1 latch 102 and the L2 latch 104. A first path selector control circuit #1, 480 receives an input IN of C1_OUT of the L1 latch 202 and a redundant input IN_R of C1_OUT of the L1 LATCH 206.

L1 latch 202 includes a series connected PFET 542 and NFET 544 providing an output L1_TP at the drain source connection, and connected between the voltage rail VDD and ground. L1 latch 206 includes a series connected PFET 546 and NFET 548 providing an output L11_TP at the drain source connection, is connected between the voltage rail VDD and ground. The respective output and redundant output OUT and OUT_R of the first path selector control circuit #1, 480, is applied to NFET 544 of L1 latch 202 and to NFET 548 of L1 latch 206.

Respective outputs C1_OUT of the L1 LATCH 202 and the C11_OUT of the L1 LATCH 206 is applied to a gate of PFET 542 of L1 latch 202 and PFET 546 of L1 latch 206. Outputs C1_OUT and L1_TP of the L1 latch 202 and the C11_OUT and L11_TP of the L1 latch 206 also are applied to FIG. 6, as shown.

Referring now to FIG. 6, the L1 latch 202 includes a transistor stack of a plurality of series connected PFETs 602, 604, 606 and a plurality of series connected NFETs 608, 610, 612 connected between the voltage rail VDD and ground. The output L1_TP of the L1 latch 202 from FIG. 5 is applied to the gate of NFET 610 and the output OUT of L11_TP1 of the path selector control circuit 480, #2 (L1 102) is applied to the gate of PFET 604. The respective clock A and clock C is applied to the gate input of PFET 602, 606. The respective inverted clock NC and clock NA is applied to the gate input of NFET 608, 612. The drain source connection of PFET 606 and NFET 608 and the output C1_OUT of the L1 LATCH 202 from FIG. 5 is applied to an inverter defined by a PFET 614 and an NFET 616 providing an inverted output L1. The inverted output L1 is applied to a passgate in the L2 latch 204 controlled by the clock B, and defined by a PFET 618 and an NFET 620. The passgate output from PFET 618 and NFET 620 is inverted by a pair of series connected inverters of the L2 latch 204 respectively defined by a PFET 622 and an NFET 624 and a PFET 626 and an NFET 630 having an output at a node L1_1. L2 latch 204 includes a series connected PFET 632 and NFET 634 providing an output L2_TP at the drain source connection, and connected between the voltage rail VDD and ground.

The L1 latch 206 includes a transistor stack of a plurality of series connected PFETs 642, 644, 646 and a plurality of series connected NFETs 648, 650, 652 connected between the voltage rail VDD and ground. The redundant output OUT_R of L1_TP1 of the path selector control circuit 480, #2 (L1 102) is applied to the gate of PFET 644 and the output L11_TP1 of the L1 latch 206 from FIG. 5 is applied to the gate of NFET 650. The respective clock A and clock C is applied to the gate input of PFET 642, 646. The respective inverted clock NC and clock NA is applied to the gate input of NFET 648, 652. The drain source connection of PFET 646 and NFET 648 and the output C11_OUT of the L1 LATCH 206 from FIG. 5 is applied to an inverter defined by a PFET 654 and an NFET 656 providing an inverted output L11. The inverted output L11 is applied to a passgate controlled by the clock B, and defined by a PFET 658 and an NFET 660 in the redundant L2 latch 208. The passgate output from PFET 658 and NFET 660 is inverted by a pair of series connected inverters of the redundant L2 latch 208 respectively defined by a PFET 662 and an NFET 664 and a PFET 666 and an NFET 668 having an output at a node L11_1. L2 latch 208 includes a series connected PFET 672 and NFET 674 providing an output L22_TP at the drain source connection, and connected between the voltage rail VDD and ground.

The second path selector control circuit #2, 480 (L1 102) receives an input IN of L1_TP of the L1 latch 202 from FIG. 5 and a redundant input IN_R of L11_TP of the L1 latch 206 from FIG. 5. The second path selector control circuit #2, 480 of L1 latch 102 provides the output OUT of L11_TP1 applied to the PFET 604 and the redundant output OUT_R of L1_TP1 applied to the PFET 644.

A first path selector control circuit #3, 480 (L2 104) receives an input IN of L1__1 of the L2 latch 204 and a redundant input IN_R of L11__1 of the L2 latch 208. The first path selector control circuit #3, 480 (L2 104) providing an output OUT applied to the PFET 634 and a redundant OUT_R applied to the PFET 674.

Outputs L1__1 and L2_TP of the L2 latch 204 and the L11__1 and L22_TP of the L2 latch 208 also are applied to FIG. 7, as shown.

Referring now to FIG. 7, the L2 latch 204 of L2 latch 104 includes a transistor stack of a pair of PFETs 702, 704 connected in series with a pair of NFETs 706, 708 connected between the voltage rail VDD and ground. The output L2_TP of the L2 latch 204 from FIG. 6 is applied to the gate of NFET 708 and the output OUT of L22_TP1 of path selector control circuit #4, 480 (L2 104) is applied to the gate of PFET 702. The clock B is applied to the gate input of PFET 704 and the inverted clock NB is applied to the gate input of NFET 706.

The L2 latch 204 of L2 latch 104 includes an inverter pair providing the output L2 of the L2 latch 204 and defined by a PFET 710 and an NFET 712 and a PFET 714 and an NFET 716. The output L2_TP of the L2 latch 204 from FIG. 6 is applied to the gate of PFET 710 and NFET 712.

The redundant L2 latch 208 of L2 latch 104 includes a transistor stack of a pair of PFETs 722, 724 connected in series with a pair of NFETs 726, 728 connected between the voltage rail VDD and ground. The output L22_TP of the redundant L2 latch 208 from FIG. 6 is applied to the gate of NFET 728 and the redundant output OUT_R of L2_TP1 of the path selector control circuit #4, 480 (L2 104) is applied to the gate of PFET 722. The clock B is applied to the gate input of PFET 724 and the inverted clock NB is applied to the gate input of NFET 726.

The redundant L2 latch 208 of L2 latch 104 includes an inverter pair providing the output L22 of the L2 latch 208 and defined by a PFET 730 and an NFET 732 and a PFET 734 and an NFET 736. The output L22_TP of the redundant L2 latch 208 from FIG. 6 is applied to the gate of PFET 730 and NFET 732.

The L2 latch 204 of L2 latch 104 includes the second path selector control circuit #4, 480 receiving an input IN of the L2_TP of the L2 latch 204 from FIG. 6 and receiving a redundant input IN_R of L22_TP of the redundant L2 latch 208 from FIG. 6. The second path selector control circuit #4, 480 of L2 latch 104 provides the output OUT of L22_TP1 applied to the PFET 702 and the redundant output OUT_R applied of L2_TP1 applied to the PFET 722.

It should be understood that the present invention is not limited for use in the illustrated DICE latch 100. For example, the present invention is not limited for use in the illustrated DICE latch 100 with multiplexed data inputs D0 and D1. The present invention can be applied to various other shift register latches and level sensitive scan design (LSSD) latches.

While the present invention has been described with reference to the details of the embodiments of the invention shown in the drawing, these details are not intended to limit the scope of the invention as claimed in the appended claims.

What is claimed is:

1. A Dual Interlocked Storage Cell (DICE) latch for implementing enhanced testability comprising:
   an L1 latch;
   an L2 latch coupled to the L1 latch;
   each said L1 latch and each said L2 latch including a first latch structure and a redundant latch structure;
   said L2 latch including a first output of said first L2 latch structure and including a second output of said redundant L2 latch structure;
   a Redundant Test Latch Enable (RTLE) input for selecting a test mode; and
   a path selector control circuit provided with each of said first latch structures and said redundant latch structures and controlled by said RTLE input for selectively providing each of said first latch structures and said redundant latch structures in a scan path for said test mode.

2. The DICE latch for implementing enhanced testability as recited in claim 1 wherein said RTLE input equals one for selecting said test mode.

3. The DICE latch for implementing enhanced testability as recited in claim 1 wherein said RTLE input equals zero for selecting a functional mode.

4. The DICE latch for implementing enhanced testability as recited in claim 1 wherein said path selector control circuit includes a crosscoupled pair of passgate control selectors.

5. The DICE latch for implementing enhanced testability as recited in claim 4 wherein each of said passgate control selectors includes a pair of passgates.

6. The DICE latch for implementing enhanced testability as recited in claim 5 wherein each passgate of said pair of passgates includes a P-channel field effect transistor (PFET) and an N-channel field effect transistor (NFET).

7. The DICE latch for implementing enhanced testability as recited in claim 6 wherein one passgate of said pair of passgates includes said RTLE input applied to a gate of said P-channel field effect transistor (PFET) and an inverted NRTLE input applied to a gate of said N-channel field effect transistor (NFET).

8. The DICE latch for implementing enhanced testability as recited in claim 6 wherein one passgate of said pair of passgates includes said RTLE input applied to a gate of said N-channel field effect transistor (NFET) and an inverted NRTLE input applied to a gate of said P-channel field effect transistor (PFET).

9. The DICE latch for implementing enhanced testability as recited in claim 6 wherein said path selector control circuit is responsive to a low RTLE input for selecting a functional mode for providing a common output of said first latch structure and said redundant latch structure of said L1 latch, said common output applied to said L2 latch.

10. The DICE latch for implementing enhanced testability as recited in claim 1 wherein said first latch structures and said redundant latch structures being provided in said scan path for said test mode includes an output of said first latch structure of said L1 latch connected to said first latch structure of said L2 latch.

11. The DICE latch for implementing enhanced testability as recited in claim 10 further includes said output of said first latch structure of said L2 latch connected to said redundant latch structure of said L1 latch.

12. The DICE latch for implementing enhanced testability as recited in claim 11 includes an output of said redundant latch structure of said L1 latch connected to said redundant latch structure of said L2 latch.

13. A method for implementing enhanced testability for a Dual Interlocked Storage Cell (DICE) latch including an L1 latch; an L2 latch coupled to the L1 latch; and each of the L1 latch and the L2 latch including a first latch structure and a redundant latch structure, and the L2 latch including a first output of said first L2 latch structure, said method comprising the steps of:
   providing a second output of said redundant latch structure of the L2 latch;
   providing a Redundant Test Latch Enable (RTLE) input for selecting a test mode for the DICE latch; and providing a path selector control circuit with each of the first latch structures and the redundant latch structures;

controlling each of said path selector control circuits by said RTLE input for selectively providing each of the first latch structures and the redundant latch structures in a scan path for said test mode.

14. The method for implementing enhanced testability for a DICE latch as recited in claim 13 wherein selectively providing each of the first latch structures and the redundant latch structures in a scan path for said test mode includes connecting an output of the first latch structure of the L1 latch to the first latch structure of the L2 latch.

15. The method for implementing enhanced testability for a DICE latch as recited in claim 14 further includes connecting an output of the first latch structure of the L2 latch to the redundant latch structure of the L1 latch.

16. The method for implementing enhanced testability for a DICE latch as recited in claim 15 further includes connecting an output of the redundant latch structure of the L1 latch to the redundant latch structure of the L2 latch.

17. The method for implementing enhanced testability for a DICE latch as recited in claim 13 further includes providing a zero RTLE input for selecting a functional mode of the DICE latch and providing a common output of the first latch structure and the redundant latch structure of said L1 latch, said common output applied to the L2 latch.

18. The method for implementing enhanced testability for a DICE latch as recited in claim 13 wherein providing said path selector control circuit includes providing a plurality of passgates to define each of said path selector control circuit.

19. The method for implementing enhanced testability for a DICE latch as recited in claim 18 wherein providing said plurality of passgates includes providing a P-channel field effect transistor (PFET) and an N-channel field effect transistor (NFET); and applying said RTLE input to a gate of said P-channel field effect transistor (PFET) and applying an inverted NRTLE input to a gate of said N-channel field effect transistor (NFET).

20. The method for implementing enhanced testability for a DICE latch as recited in claim 18 wherein providing said plurality of passgates includes providing a P-channel field effect transistor (PFET) and an N-channel field effect transistor (NFET) defining said passgate; and applying said RTLE input to a gate of said N-channel field effect transistor (NFET) and applying an inverted NRTLE input to a gate of said P-channel field effect transistor (PFET).

* * * * *